United States Patent
Cutter et al.

[11] Patent Number: 5,973,978
[45] Date of Patent: *Oct. 26, 1999

[54] ANTI-FUSE PROGRAMMING PATH

[75] Inventors: Douglas J. Cutter, Fort Collins, Colo.; Fan Ho; Kurt D. Beigel, both of Boise, Id.

[73] Assignee: Micron Technology, Inc., Boise, Id.

[*] Notice: This patent is subject to a terminal disclaimer.

[21] Appl. No.: 09/143,229

[22] Filed: Aug. 28, 1998

Related U.S. Application Data

[63] Continuation of application No. 08/742,820, Oct. 29, 1996, Pat. No. 5,838,625.

[51] Int. Cl.[6] .................................................. G11C 17/16
[52] U.S. Cl. ........................................ 365/225.7; 365/200
[58] Field of Search ................................ 365/225.7, 200, 365/96; 257/530

[56] References Cited

U.S. PATENT DOCUMENTS 5,838,625  11/1998  Cutter et al. ........................ 365/225.7

*Primary Examiner*—Tan T. Nguyen
*Attorney, Agent, or Firm*—Schwegman, Lundberg, Woessner & Kluth P.A.

[57] ABSTRACT

A programmable circuit in an integrated circuit provides a programmed signal, which is based on the state of a first node. An anti-fuse includes a first terminal coupled to the first node and a second terminal coupled to a programming bus. An anti-fuse programming pad is coupled to the first programming bus for permitting a sufficient voltage to short the first anti-fuse to be applied to the first programming bus from external to the integrated circuit. The state of the programmed signal can be used to replace a primary circuit element in the integrated circuit, such a row or column of memory cells in a memory integrated circuit, with a redundant circuit element.

23 Claims, 3 Drawing Sheets

ANTI-FUSE PROGRAMMING PATH

This application is a continuation of U.S. Ser. No. 08/742,820 filed Oct. 29, 1996 now U.S. Pat. No. 5,838,625.

THE FIELD OF THE INVENTION

The present invention relates generally to integrated circuits, and more particularly to programming of anti-fuse controlled programmable circuits used to replace primary circuit elements with redundant circuit elements in integrated circuits such as memory integrated circuits.

BACKGROUND OF THE INVENTION

Technological advances have permitted semiconductor integrated circuits to comprise significantly more circuit elements in a given silicon area. Reducing and eliminating defects in the circuit elements has, however, become increasingly more difficult with the increased number of circuit elements. To achieve higher population capacities, circuit designers strive to reduce the size of the individual circuit elements to maximize available die real estate. The reduced size makes these circuit elements increasingly susceptible to defects caused by material impurities during fabrication. Nevertheless, the defects are identifiable upon completion of the integrated circuit fabrication by testing procedures, either at the semiconductor chip level or after complete packaging. Scrapping or discarding defective integrated circuits when defects are identified is economically undesirable, particularly if only a small number of circuit elements are actually defective.

Relying on zero defects in the fabrication of integrated circuits is an unrealistic option. Therefore, redundant circuit elements are provided on integrated circuits to reduce the number of scrapped integrated circuits. If a primary circuit element is determined to be defective, a redundant circuit element is substituted for the defective primary circuit element. Substantial reductions in scrap are achieved by using redundant circuit elements without substantially increasing the cost of the integrated circuit.

One type of integrated circuit device which uses redundant circuit elements is integrated memory circuits, such as dynamic random access memories (DRAMs), static random access memories (SRAMs), video random access memories (VRAMs), and erasable programmable read only memories (EPROMs). Typical integrated memory circuits comprise millions of equivalent memory cells arranged in arrays of addressable rows and columns. The rows and columns of memory cells are the primary circuit elements of the integrated memory circuit. By providing redundant circuit elements, either as rows or columns, defective primary rows, columns, or individual bits can be replaced.

Because the individual primary circuit elements (rows or columns) of an integrated memory circuit are separately addressable, replacing a defective circuit element typically entails blowing fuses or anti-fuses in fuse-controlled programmable circuits to "program" a redundant circuit element to respond to the address of the defective primary circuit element. This process is very effective for permanently replacing defective primary circuit elements.

In the case of DRAMs, for example, a particular memory cell is selected by first providing a unique row address of the row in which the particular memory cell is located and subsequently providing a unique column address of the column in which the particular memory cell is located. Redundancy circuitry must recognize the address of the effective primary circuit element and reroute all signals to the redundant circuit element when the address to the defective primary circuit element is presented by the user. Therefore, a number of fuses or anti-fuses are associated with each redundant circuit element. The possible combinations of blown and unblown fuses corresponding to each redundant circuit element represent unique addresses of all primary circuit elements for which a corresponding redundant circuit element may be substituted.

During testing of the DRAM, or other integrated circuit, at the factory, any defective primary circuit elements are identified. A suitable redundant circuit element is selected, and the corresponding fuses or anti-fuses are blown in a predetermined order to represent the address of the defective primary circuit element to be replaced. When using the DRAM, each address provided to the DRAM must be compared to the corresponding fuses or anti-fuses to determine if a redundant match is present. Whenever the redundant match is detected, the primary circuit element is suppressed and the redundant circuit element is activated to perform the required function.

As mentioned above, fuses or anti-fuses can be used in the fuse-controlled programmable circuits. In a DRAM, an anti-fuse is typically a nitrite capacitor which is essentially a normal memory array cell used as a blowable capacitor. Thus, no extra process steps are required in the fabrication of a DRAM to produce an anti-fuse. Unlike the fuse which is open after being blown, the anti-fuse is typically a one-time blowable or programmable element which remains shorted when the circuit is powered down and re-powered up.

Typically, the programming path employed to program a conventional anti-fuse controlled programmable circuit comprises a program/ground CGND bus coupled to Vpop circuitry which provides a sufficiently high voltage, such as 10 volts, to exceed the breakdown voltage of the anti-fuse to be programmed. There is a desire in the art to decrease the series resistance in this programming path. In addition, there is a need to increase the maximum programming voltage which can be applied to the anti-fuse to provide a better resistance distribution in blown anti-fuses and to provide a faster anti-fuse programming time.

SUMMARY OF THE INVENTION

The present invention provides an integrated circuit having a programmable circuit providing a programmed signal. The state of the programmed signal is based on the state of a first node in the programmable circuit. The programmable circuit includes a first programming bus and a first anti-fuse having a first terminal coupled to the first node and a second terminal coupled to the first programming bus. An anti-fuse programming pad is coupled to the first programming bus for permitting a sufficient voltage to short the first anti-fuse to be applied to the first programming bus from external to the integrated circuit.

In one embodiment of the integrated circuit according to the present invention, the programmable circuit also includes a second programming bus, and a second anti-fuse having a first terminal coupled to the first node and a second terminal coupled to the second programming bus. Vpop circuitry supplies a sufficient voltage to short the second anti-fuse to the second programming bus from internal to the integrated circuit. A control pad coupled to the Vpop circuitry for permitting external control of when the sufficient voltage to short the second anti-fuse is supplied from the Vpop circuitry.

The Vpop circuitry forces the second programming bus to Vcc or VCCP if the sufficient voltage to short the first anti-fuse is applied to the first programming bus from external to the integrated circuit via the anti-fuse programming pad. This substantially reduces or eliminates damage to the second anti-fuse when the sufficient voltage to short the first anti-fuse is applied to the first programming bus from external to the integrated circuit via the anti-fuse programming pad.

The anti-fuse programming pad is preferably bonded to ground after wafer or die level repair is complete. In addition, the integrated circuit preferably includes circuitry for indicating whether the first anti-fuse is shorted during wafer or probe testing. In this way, the user knows whether the second anti-fuse is available for programming after packaging of the integrated circuit. The second anti-fuse can only be programmed if the first anti-fuse has not been programmed during probe.

In one application of the present invention, the integrated circuit includes primary circuit elements, such as rows or columns of memory cells in a memory integrated circuit. The integrated circuit also includes at least one redundant circuit element. A selected one of the primary circuit elements is replaceable by the at least one redundant circuit element based on the state of programmed signals.

In another application of the present invention, the integrated circuit includes a fuse identification based on the state of programmed signals. In another application of the present invention, the integrated circuit includes a mode of operation based on the state programmed signals.

The programmable circuit according to the present invention permits the voltage applied to the anti-fuse programming pad at the wafer level to be raised above the typical breakdown voltage for faster programming and a tighter resistance distribution after programming. Furthermore, the total resistance in the first programming path (including the first programming bus and the anti-fuse programming pad) is substantially less because the first programming bus couples directly to the anti-fuse programming pad and is not limited by transistor sizing and boot efficiency of the Vpop circuitry. By minimizing the resistance in the programming path, multiple anti-fuses can be programmed in parallel.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM). The present invention is not limited to DRAMs, as the present invention is equally applied to other memory devices such as static random access memories (SRAMs), video random access memories (VRAMs), and erasable programmable read only memories (EPROMs). In fact, the present invention can be applied to any electronic integrated circuit having primary and redundant circuitry comprising separately addressable circuit elements.

Example DRAM Configuration

Figure 1C:
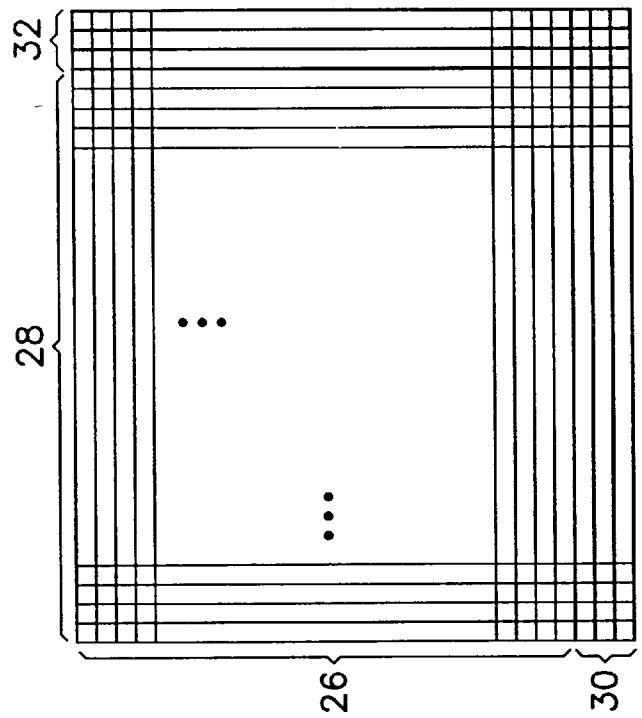
FIG. 1A–1C are illustrations of a suitable configuration of a 64 megabit DRAM having redundancy circuitry according to the present invention.
Figure 1B:
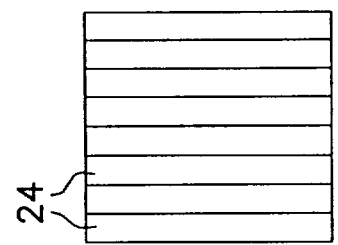
Figure 1A:
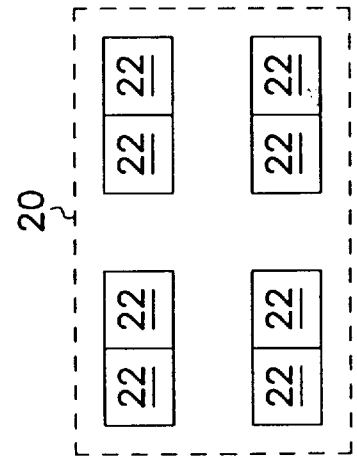

Addressable memory cells of a 64 megabit DRAM according to the present invention are illustrated generally at 20 in FIG. 1A. The 64 megabit DRAM according to the present invention is similar in many respects to conventional DRAMs, such as those commercially available from Micron Technology, Inc. of Boise, Id. For clarity, only a portion of the well known circuitry of the DRAM is described herein, while the new circuitry of the DRAM of the present invention is described in detail herein. As illustrated in FIG. 1A, the 64 megabit DRAM includes eight sections 22. As illustrated in FIG. 1B, each section 22 includes eight subsections or arrays 24. As illustrated in FIG. 1C, each array 24 includes one megabit of memory cells arranged in 512 addressable primary rows or circuit elements 26 and 2048 addressable primary columns or circuit elements 28.

In addition, in the embodiment of the 64 megabit DRAM according to the present invention illustrated in FIGS. 1A–1C, each array 24 includes four addressable redundant rows or circuit elements 30 and four addressable redundant columns or circuit elements 32. Four redundant rows and four redundant columns are shown in FIG. 1C for illustrative purposes only, and the exact number of redundant circuit elements included in a DRAM or other integrated circuit according to the present invention is determined based on known design criteria.

Each primary row 26 is uniquely addressable. Thus, any one of the primary rows 26 in the DRAM can be addressed using twelve address lines (i.e., nine address lines corresponding to the 512 primary rows 26 and three address lines corresponding to the eight sections 22). If testing procedures indicate that a primary row is defective, a redundant row 30 is "programmed" to replace the defective primary row 26. This is accomplished by programming a redundant row 30 to respond to the address corresponding to the defective primary row 26.

Each primary column 28 is also uniquely addressable. Thus, any one of the primary columns 28 in the DRAM can be addressed using fourteen address lines (i.e., eleven address lines corresponding to the 2048 primary columns 28 and three address lines corresponding to the eight arrays 24). If testing procedures indicate that a primary column is defective, a redundant column 32 is "programmed" to replace the defective primary column 28. This is accomplished by programming a redundant column 32 to respond to the address corresponding to the defective primary column 28.

Match Anti-Fuse Bank Circuit

Figure 2:
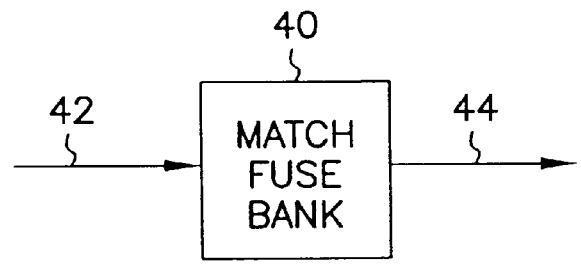
FIG. 2 is a block diagram of match anti-fuse bank circuit according to the present invention, which is employed in the DRAM partially illustrated in FIG. 1A–1C.

Referring to FIG. 2, each of the four redundant rows 30 and each of the four redundant columns 32 of each array 24 includes a corresponding multi-bit address/anti-fuse comparison circuit module or match anti-fuse bank circuit 40 according to the present invention. Each match anti-fuse bank circuit 40 is capable of receiving a multi-bit address signal, indicated at 42, in the form of a pre-decoded signal or a non-predecoded signal depending on the embodiment of the match anti-fuse bank. The address signal 42 is used to address the primary rows 26 at one time and the primary columns at a subsequent time based on the state of selected command input signals to the DRAM. Each match anti-fuse bank circuit 40 is selectively programmable to respond to a specific value of the address signal 42. Each match anti-fuse bank circuit 40 evaluates the address signal 42 and activates a match signal, indicated at 44, if the row address value of address signal 42 corresponds to the address of a defective primary row 26 which the match anti-fuse bank circuit is programmed to replace. Similarly, each match anti-fuse bank circuit 40 activates the match signal 44 if the column address value of address signal 42 corresponds to the address of a defective primary column 28 which the match anti-fuse bank circuit is programmed to replace.

The match signal 44, when activated by the corresponding match anti-fuse bank circuit 40, causes the associated redundant row 30 or the associated redundant column 32 to be accessed. The activated match signal 44 also disables the associated defective primary row 26 or the associated primary column 28 such that the associated defective primary row or column cannot respond to the address signal 42.

Conventional Anti-Fuse Controlled Programmable Circuit

The present invention is better understood by first describing a conventional anti-fuse controlled programmable circuit. Such a conventional anti-fuse controlled programmable circuit 50 is illustrated in schematic diagram form in FIG. 3. The layout of single anti-fuse controlled programmable circuit 50, as illustrated in FIG. 3, is similar to conventional anti-fuse controlled programmable circuits for the individual address bits of prior art match anti-fuse bank circuits.

Various control signals are provided to conventional anti-fuse controlled programmable circuit 50. A fuse program (FP*) signal derived from the row address strobe (RAS) signal to the DRAM is provided on a line 64. A fuse bank select (FBSEL*) signal is provided on a line 66. FBSEL* is typically a high-order address bit which is low when the particular fuse bank is selected for programming. A test mode signal (PRG*) which indicates that anti-fuses can be programmed when low, is provided on a line 68.

Figure 3:
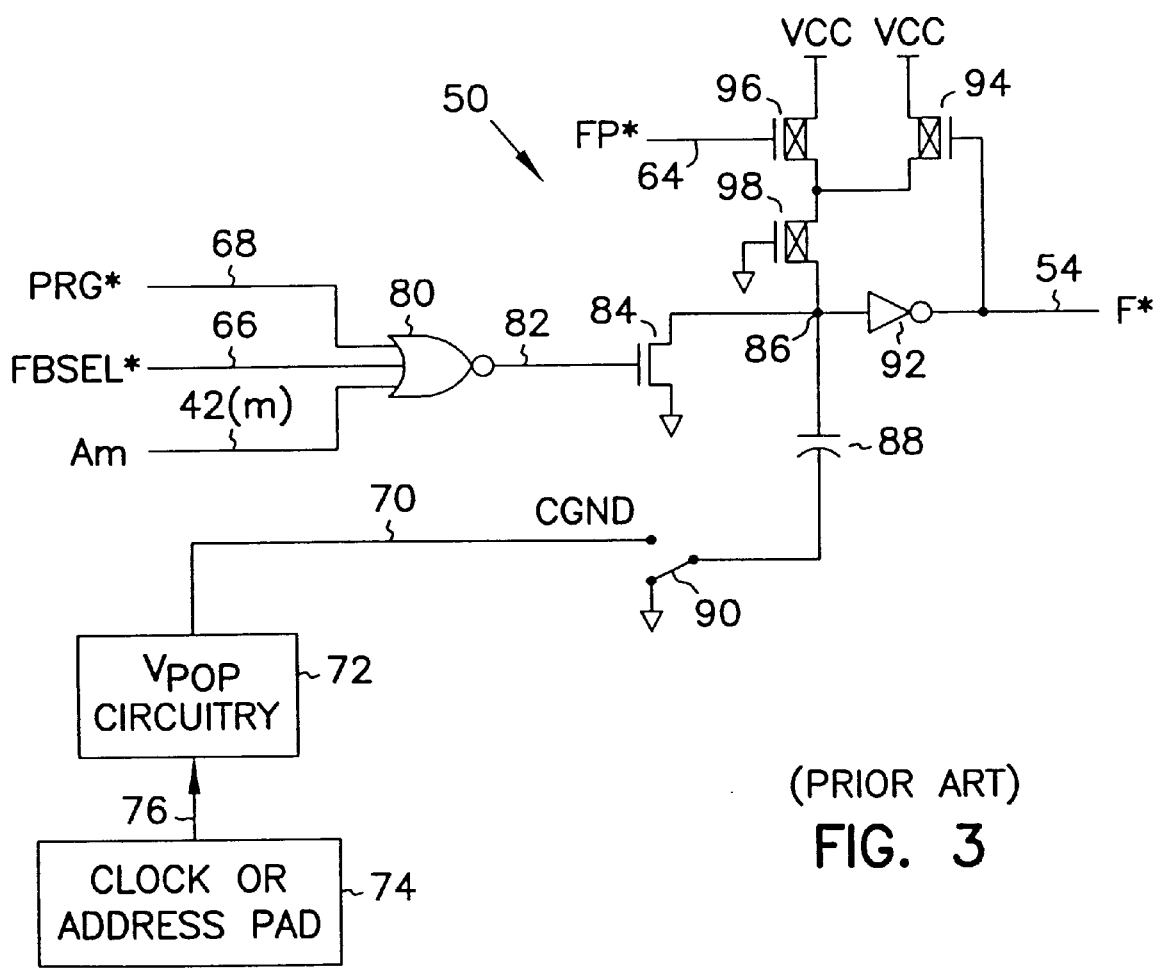
FIG. 3 is a schematic diagram of a conventional anti-fuse controlled programmable circuit.

As illustrated in FIG. 3, a three input NOR gate 80 receives the PRG* signal on line 68, the FBSEL* signal on line 66, and the Am* signal on line 42 (m) and activates an output line 82 when all three input signals are a low-logic level. The output of NOR gate 80 on line 82 is provided to the gate of an n-channel transistor 84. The source of n-channel transistor 84 is coupled to a ground node. The drain of n-channel transistor 84 is coupled to a node 86. With the PRG*, FBSEL* and the Am* signals all low, line 82 becomes high to turn transistor 84 on. With transistor 84 on, node 86 is effectively coupled to the ground node.

An anti-fuse 88 has one of its terminals coupled to node 86 and its other terminal coupled to a switch 90. Switch 90 switches between a ground node and a program/ground CGND bus 70. During programming, switch 90 switches to the CGND bus 70 and during normal operations, switch 90 switches to the ground node. In this way, during programming one terminal of anti-fuse 88 is coupled to a ground level at node 86 and the other terminal is coupled to the CGND bus 70. In programming anti-fuse 88, Vpop circuitry 72 provides a high voltage on the CGND bus 70, such as 10 volts or the voltage needed to exceed the breakdown voltage of anti-fuse 88 to permanently short anti-fuse 88. A clock or address pad 74 is coupled to Vpop circuitry 72 via a line 76. In this way, a user of the DRAM or other integrated circuit can control the operation of the Vpop circuitry to control when the CGND bus is to be pulsed high to program anti-fuse 88.

Node 86 is also coupled to the input of an inverter 92 which sup the F* signal on line 54 from conventional anti-fuse controlled programmable circuit 50. The F* signal is coupled to the gate of a p-channel transistor 94. The source of p-channel transistor 94 is coupled to the Vcc power supply. The FP* signal on line 64 is provided to the gate of a p-channel transistor 96. The source of p-channel transistor 96 is coupled to the Vcc power supply. The drains of p-channel transistors 94 and 96 are coupled together and coupled to the source of a long-L p-channel pull-up transistor 98. The gate of long-L p-channel pull-up transistor 98 is coupled to ground. The drain of long-L p-channel pull-up transistor 98 is coupled to node 86.

In operation, when anti-fuse 88 is not programmed (open), node 86 is pulled toward VCC to provide a low or zero output on the F* line 54. When anti-fuse 88 is programmed (shorted), node 86 is pulled to the ground level, which when inverted by inverter 92, produces a high or one output on the F* line 54.

Anti-Fuse Controlled Programmable Circuit with Anti-Fuse Programming Pad

Figure 4:
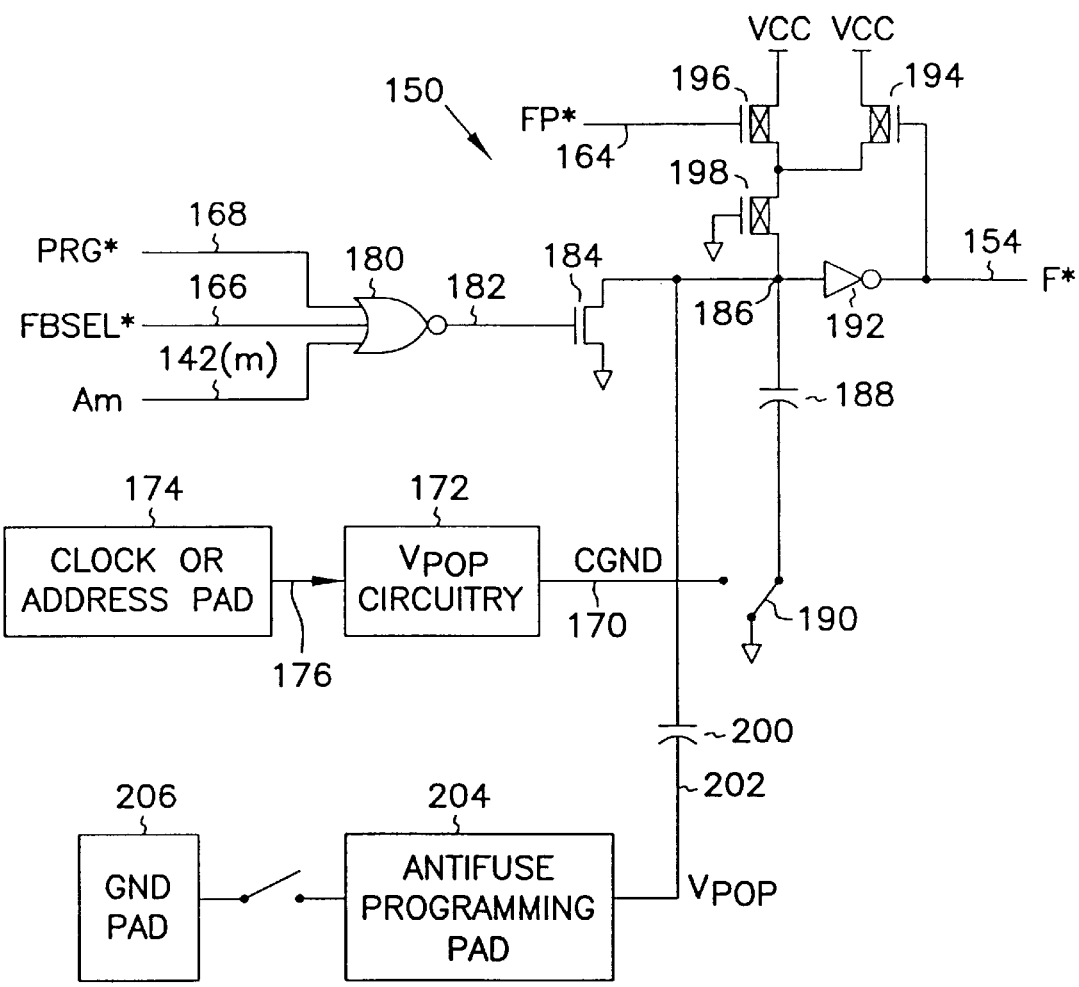
FIG. 4 is a schematic diagram of an anti-fuse controlled programmable circuit according to the present invention.

An anti-fuse controlled programmable circuit 150 according to the present invention is illustrated in schematic diagram form in FIG. 4. Multiple anti-fuse controlled programmable circuits 150 are employed in match anti-fuse bank circuit 40 for programming the match anti-fuse bank circuit to cause a redundant circuit element, such a row or column, to respond to the address corresponding to a defective primary circuit element.

As with conventional anti-fuse controlled programmable circuit 50, various control signals are provided to anti-fuse controlled programmable circuit 150. The FP* signal derived from the RAS signal is provided on a line 164. The FBSEL* signal is provided on a line 166. The PRG* signal, which indicates that anti-fuses can be programmed when low, is provided on a line 168.

As illustrated in FIG. 4, a three input NOR gate 80 receives the PRG* signal on line 168, the FBSEL* signal on line 166, and the Am* signal on line 142 (m) and activates an output line 182 when all three input signals are a low-logic level. The output of NOR gate 180 on line 182 is provided to the gate of an n-channel transistor 184. The source of n-channel transistor 184 is coupled to a ground node. The drain of n-channel transistor 184 is coupled to a node 186. With the PRG*, FBSEL* and the Am* signals all low, line 182 becomes high to turn transistor 184 on. With transistor 184 on, node 186 is effectively coupled to the ground node.

Node 186 is also coupled to the input of an inverter 192 which supplies the F* signal on line 154 from anti-fuse controlled programmable circuit 150 according to the present invention. The F* signal is coupled to the gate of a p-channel transistor 194. The source of p-channel transistor 194 is coupled to the Vcc power supply. The FP* signal on line 164 is provided to the gate of a p-channel transistor 196. The source of p-channel transistor 196 is coupled to the Vcc power supply. The drains of p-channel transistors 194 and 196 are coupled together and coupled to the source of a long-L p-channel pull-up transistor 198. The gate of long-L p-channel pull-up transistor 198 is coupled to ground. The drain of long-L p-channel pull-up transistor 198 is coupled to node 186.

The anti-fuse controlled programmable circuit 150 according to the present invention comprises an anti-fuse 200. Anti-fuse 200 has one of its terminals coupled to node 186 and its other terminal coupled to a program/ground Vpop bus 202. The Vpop bus 202 is coupled directly to an anti-fuse programming pad 204. During wafer or probe testing, anti-fuse 200 can be programmed by a user providing a high voltage, such as 10 volts, or the voltage needed to exceed the breakdown voltage of anti-fuse 200 to permanently short anti-fuse 200.

Anti-fuse programming pad 204 is forced to a ground level by a tester during post-repair functional tests. In the assembly of the DRAM or other integrated circuit according to the present invention, anti-fuse programming pad 204 is preferably bonded to ground, such as by coupling the anti-fuse programming pad to a ground pad 206.

In operation, when anti-fuse 200 is not programmed (open), node 186 is pulled toward VCC to provide a low or zero output on the F* line 154. When anti-fuse 200 is programmed (shorted), node 186 is pulled to the ground level, which when inverted by inverter 192, produces a high or one output on the F* line 154.

When programming anti-fuse controlled programmable circuit 150 according to the present invention during wafer or probe testing, anti-fuse programming pad 204 permits a breakdown voltage to be applied directly to the Vpop bus 202 to short anti-fuse 200. By contrast, in programming the conventional anti-fuse programmable circuit 50 during probe testing, the Vpop circuitry 72 is required to supply the high voltage on the CGND bus 70 to short anti-fuse 88. As a result, the programming time required to program anti-fuse 200 is much less than the programming time required to program anti-fuse 88. In addition, the distribution and relative value of anti-fuse resistances after programming is greatly improved with the use of anti-fuse 200. This is accomplished because the series resistance in the programming path according to the present invention (Vpop bus 202 and anti-fuse programming pad 204) is greatly decreased compared to the conventional programming path (CGND bus 70, Vpop circuitry 72, and clock or address pad 74).

Additionally, an increased maximum programming or breakdown voltage can be applied to anti-fuse 200 as compared to anti-fuse 88. Anti-fuse programming pad 204 and the Vpop bus 202 bypass the typically used Vpop circuitry. Therefore, electrostatic discharge (ESD) device problems and related junction breakdown voltage problems which restrict the maximum programming voltage are essentially eliminated. The higher programming voltage yields a better resistance distribution. In addition, the higher programming voltage permits faster programming. Furthermore, reduced series resistance allows more anti-fuses to be blown at the same time or in parallel.

The anti-fuse controlled programmable circuit 150 according to the present invention comprises a second anti-fuse 188 similar to anti-fuse 88 of conventional anti-fuse controlled programmable circuit 50. Anti-fuse 188 has one of its terminals coupled to node 186 and its other terminal coupled to a switch 190. Switch 190 switches between a ground node and a program/ground CGND bus 170. During programming, switch 190 switches to the CGND bus 170 and during normal operations, switch 190 switches to the ground node. In this way, during programming one terminal of anti-fuse 188 is coupled to a ground level at node 186 and the other terminal is coupled to the CGND bus 170. In programming anti-fuse 188, Vpop circuitry 172 provides a high voltage on the CGND bus 170, such as 10 volts or the voltage needed to exceed the breakdown voltage of anti-fuse 188 to permanently short anti-fuse 188. A clock or address pad 174 is coupled to Vpop circuitry 172 via a line 176. In this way, a user of the DRAM or other integrated circuit can control the operation of the Vpop circuitry to control when the CGND bus is to be pulsed high to program anti-fuse 188.

In operation, when anti-fuse 188 is not programmed (open), node 186 is pulled toward VCC to provide a low or zero output on the F* line 154. When anti-fuse 188 is programmed (shorted), node 186 is pulled to the ground level, which when inverted by inverter 192, produces a high or one output on the F* line 154.

The CGND bus 170 which is programmed through the Vpop circuitry 172 through control of the clock or address pad 174 allows the anti-fuse controlled programmable circuit 150 to be programmed after the integrated circuit package is formed. One of the major advantages to using anti-fuses in programmable circuits is that anti-fuses are typically programmable even after package formation. Since the clock or address pad 174 is directly coupled to Vpop circuitry 172 through line 176, once in package form, anti-fuse 188 is still programmable in the DRAM or other integrated circuit according to the present invention when anti-fuse 200 is not programmed during wafer or probe testing. A control signal is applied to the clock or address pad 174 to control Vpop circuitry 172 is determine when the CGND bus 170 is to be pulsed high to program anti-fuse 188.

In regards to anti-fuse 200, by removing all N-plus active areas from anti-fuse programming pad 204, a higher programming voltage to short anti-fuse 200 is achievable. In order to remove all N-plus active areas from the programming pad, anti-fuse 200 is preferably constructed as a "junction-less" anti-fuse such as described in co-pending patent application entitled METHOD AND APPARATUS FOR FORMING A JUNCTION-LESS ANTI-FUSE, filed on Aug. 26, 1996 and assigned to the assignee of the present application, and which is herein incorporated by reference. The junction-less anti-fuse described in the METHOD AND APPARATUS FOR FORMING A JUNCTION-LESS ANTI-FUSE application achieves a structure in which all N-plus regions are removed from the Vpop bus 202.

A bit is preferably reserved in a fuse identification (ID) for the integrated circuit to indicate whether a redundant bank has been used at probe. The fuse ID is a pattern of binary digits which uniquely identify the integrated circuit chip and can be decoded after the chip is packaged or integrated onto a circuit board. If a bank has been programmed through the external anti-fuse programming pad 204 during probe, its corresponding anti-fuse 188 cannot be programmed after packaging. If either anti-fuse 188 or anti-fuse 200 is programmed or shorted, anti-fuse programmable circuit 150 enables the F* signal. As an alternative to the anti-fuse ID, the resistance or state of the F* output can be determined for each bank to indicate whether a redundant bank has been used at probe.

When the pull-down transistor 184 is off and the Vpop bus 202 is pulsed high, the internal voltage on node 186 can couple up to a high voltage level which actually damages anti-fuse 188. By forcing CGND 170 to Vcc or VCCP when using the anti-fuse programming pad 204 to provide a high programming voltage on the Vpop bus 202, the damage to anti-fuse 188 is substantially reduced or eliminated. Typically, Vpop circuitry 172 forces the CGND bus 170 to Vcc or VCCP when anti-fuse 200 is programmed through anti-fuse programming pad 204 and Vpop bus 202 to prevent damage to un-selected anti-fuse bits.

By programming one of either anti-fuse 200 (at probe) or anti-fuse 188(in package), the user of the DRAM, or other integrated circuit according to the present invention, can select the desired state of the output F* signal on line 154 of anti-fuse controlled programmable circuit 150. As described above, anti-fuse controlled programmable circuit 150 is employed in match anti-fuse bank 40 illustrated in FIG. 2 for programming to respond to specific values of the address signal 42 for replacing primary circuit elements, such as row or columns of a DRAM, with redundant circuit elements. Anti-fuse controlled programmable circuit 150 is, however, alternatively embodied in a variety of circuit applications where a programming feature is required. For example, multiple anti-fuse controlled programmable circuits 150 are employed to generate the fuse ID for an integrated circuit.

Anti-fuse controlled programmable circuit 150 is alternatively embodied in another form of the present invention to select a mode of operation in the integrated circuit. For example, the amount of refresh available in a memory integrated circuit can be controlled with multiple dual anti-fuse controlled programmable circuits 150, such as by selecting between 4K rows or 8K rows in a 64 Meg DRAM. Another mode of operation application is to utilize dual anti-fuse programmable circuit 150 for slowing down or speeding up the integrated circuit. In another mode of operation application dual anti-fuse controlled programmable circuits 150 is employed to select either a fast page mode for a memory integrated circuit or an extended data out (EDO) mode for the memory integrated circuit.

Conclusion

The anti-fuse controlled programmable circuit 150 according to the present invention eliminates junction breakdown altogether on the Vpop bus 202. In this way, the voltage used on anti-fuse programming pad 204 at the wafer level can be raised above the typical breakdown voltage for faster programming and a tighter resistance distribution after programming. Furthermore, the total resistance in the programming path (including Vpop bus 202 and anti-fuse programming pad 204) is substantially less because the Vpop bus couples directly to anti-fuse programming pad 204 and is not limited by transistor sizing and boot efficiency of the Vpop circuitry 172. By minimizing the resistance in the programming path, multiple anti-fuses can be programmed in parallel.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A programmable circuit providing a programmed signal in an integrated circuit comprising:
   a first node carrying the programmed signal;
   a first programming bus;
   a first anti-fuse including a first terminal coupled to the first node and a second terminal coupled to the first programming bus;
   a first anti-fuse programming pad coupled to the first programming bus for permitting a sufficient voltage to short the first anti-fuse to be applied to the first programming bus;
   a second programming bus;
   a second anti-fuse including a first terminal coupled to the same first node and a second terminal; and
   a second pad coupled to the second programming bus for supplying a sufficient voltage to short the second anti-fuse.

2. The circuit of claim 1 wherein the second pad is coupled to circuitry for supplying the sufficient voltage to short the second anti-fuse.

3. The circuit of claim 2 wherein the circuitry for supplying the sufficient voltage to short the second anti-fuse is located on the same integrated circuit chip with the programmable circuit.

4. The circuit of claim 1 wherein the sufficient voltage to short the first anti-fuse is applied from external to the chip.

5. The circuit of claim 4 wherein the first programming pad is bonded to a fixed voltage after the sufficient voltage to short the first anti-fuse is applied to the first programming bus is applied.

6. The circuit of claim 5 wherein the first anti-fuse programming pad is bonded to ground during assembly and packaging of the integrated circuit.

7. An integrated circuit comprising:
   primary circuit elements selectable by binary values of a set of input bits;
   redundant circuit elements; and
   a programmable circuit for substituting the redundant circuit elements for the primary circuit elements for certain binary values of the set of input bits, the programmable circuit including
      a first node carrying the programmed signal,
      a first programming bus,
      a first anti-fuse including a first terminal coupled to the first node and a second terminal coupled to the first programming bus,
      a first anti-fuse programming pad coupled to the first programming bus for permitting a sufficient voltage to short the first anti-fuse to be applied to the first programming bus,
      a second programming bus;
      a second anti-fuse including a first terminal coupled to the same first node and a second terminal, and
      a second pad coupled to the second programming bus for supplying a sufficient voltage to short the second anti-fuse.

8. The integrated circuit of claim 7 comprising a plurality of the programmable circuits.

9. The integrated circuit of claim 8 wherein each of the plurality of programmable circuits is associated with a different one of the redundant circuit elements.

10. The integrated circuit of claim 7 wherein the circuit elements are memory cells.

11. The integrated circuit of claim 10 wherein the memory cells are arranged in rows and columns.

12. The integrated circuit of claim 11 wherein the primary circuit elements comprise rows of memory cells.

13. The integrated circuit of claim 11 wherein the primary circuit elements comprise columns of memory cells.

14. A programmable circuit providing a programmed signal in an integrated circuit comprising:
   a first node carrying the programmed signal;
   a first programming bus;
   a first anti-fuse including a first terminal coupled to the first node and a second terminal coupled to the first programming bus; and
   an anti-fuse programming pad coupled to the first programming bus for permitting a sufficient voltage to short the first anti-fuse to be applied to the first programming bus from external to the integrated circuit, the anti-fuse programing pad thereafter being bonded to a fixed voltage.

15. An integrated circuit comprising:

a first node carrying a programmed signal;

a first programing bus;

a first anti-fuse including a first terminal coupled to the first node and a second terminal coupled to the first programming bus; and an anti-fuse programming pad coupled to the first programming bus for permitting a sufficient voltage to short the first anti-fuse to be applied to the first programming bus from external to the integrated circuit, the anti-fuse programming pad thereafter being bonded to a fixed voltage.

16. The integrated circuit of claim 15 wherein the integrated circuit is a memory integrated circuit.

17. The integrated circuit of claim 16 wherein the memory integrated circuit is a dynamic random access memory (DRAM).

18. The integrated circuit of claim 15 further comprising:

primary circuit elements; and a redundant circuit element, wherein a selected one of the primary circuit elements is replaceable by the redundant circuit element based on the programmed signal.

19. The integrated circuit of claims 18 wherein the integrated circuit is a memory integrated circuit comprising an array of memory cells arranged in rows and columns, and wherein the primary circuit elements comprise rows of memory cells.

20. The integrated circuit of claim 18 wherein the integrated circuit is a memory integrated circuit comprising an array of memory cells arranged in rows and columns, and wherein the primary circuit elements comprise columns of memory cells.

21. The integrated circuit of claim 18 wherein the integrated circuit is a memory integrated circuit comprising an array of memory cells arranged in rows and columns, and wherein the primary circuit elements comprise rows and columns of memory cells.

22. An integrated circuit comprising:

a first node carrying a programmed signal;

a first programming bus;

a first anti-fuse including a first terminal coupled to the first node and a second terminal coupled to the first programming bus; and an anti-fuse programming pad coupled to the first programming bus for permitting a sufficient voltage to short the first anti-fuse to be applied to the first programming bus from external to the integrated circuit, wherein the integrated circuit includes a mode of operation based on the state the programmed signal.

23. A method of programming an integrated circuit comprising the step of:

applying a programming voltage to an anti-fuse programming pad, the anti-fuse programming pad being coupled to a first programming bus, which is coupled to a first anti-fuse, wherein the programming voltage is sufficient to short the first anti-fuse; and thereafter bonding the anti-fuse programming pad to a fixed voltage.

* * * * *